(12) United States Patent
Misono

(10) Patent No.: US 10,090,490 B2
(45) Date of Patent: Oct. 2, 2018

(54) METHOD OF PRODUCING CURVED DISPLAY PANEL

(71) Applicant: Sharp Kabushiki Kaisha, Sakai, Osaka (JP)

(72) Inventor: Kenji Misono, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/531,387

(22) PCT Filed: Nov. 25, 2015

(86) PCT No.: PCT/JP2015/082997
§ 371 (c)(1),
(2) Date: May 26, 2017

(87) PCT Pub. No.: WO2016/088615
PCT Pub. Date: Jun. 9, 2016

(65) Prior Publication Data
US 2017/0331076 A1 Nov. 16, 2017

(30) Foreign Application Priority Data

Dec. 2, 2014 (JP) ................................. 2014-243764

(51) Int. Cl.
*H01L 51/56* (2006.01)
*H01L 51/00* (2006.01)
(Continued)

(52) U.S. Cl.
CPC ............ *H01L 51/56* (2013.01); *G02F 1/1333* (2013.01); *G02F 1/1339* (2013.01); *G09F 9/00* (2013.01); *G09F 9/30* (2013.01); *H01L 51/003* (2013.01); *H01L 51/0096* (2013.01); *H01L 51/0097* (2013.01); *H01L 51/5246* (2013.01);
(Continued)

(58) Field of Classification Search
None
See application file for complete search history.

(56) References Cited

U.S. PATENT DOCUMENTS

2009/0213319 A1    8/2009    Sasaki et al.
2010/0253902 A1*  10/2010   Yamazaki ............ G02F 1/1303
                                                                      349/158

FOREIGN PATENT DOCUMENTS

JP          2009204713 A       9/2009

* cited by examiner

*Primary Examiner* — Jay C Chang
(74) *Attorney, Agent, or Firm* — ScienBiziP, P.C.

(57) ABSTRACT

A method includes a supporting step supporting first planar surfaces of two substrates 20A and 30A having flexibility with supporting boards 50 and 60 each having flexibility and a larger thickness than the two substrates 20A and 30A, a thin film pattern formation step, after the supporting step, forming a thin film pattern on second planar surfaces of the two substrates 20A and 30A, a bonding step, after the thin film pattern formation step, bonding the two substrates 20A and 30A at surfaces each having the thin film pattern thereon with the sealant therebetween to form a bonded substrate 70, a first curving step, after the bonding step, curving the bonded substrate 70 while curing the sealant, a detachment step, after the first curving step, detaching the supporting boards 50 and 60 from the bonded substrate 70, and a second curving step, after the detachment step, further curving the bonded substrate 70.

5 Claims, 9 Drawing Sheets

(51) Int. Cl.
*H01L 51/52* (2006.01)
*G02F 1/1333* (2006.01)
*G02F 1/1339* (2006.01)
*G09F 9/00* (2006.01)
*G09F 9/30* (2006.01)

(52) U.S. Cl.
CPC .. *G02F 1/133305* (2013.01); *G02F 1/133351* (2013.01); *G02F 2201/56* (2013.01); *H01L 2227/326* (2013.01)

FIG.9
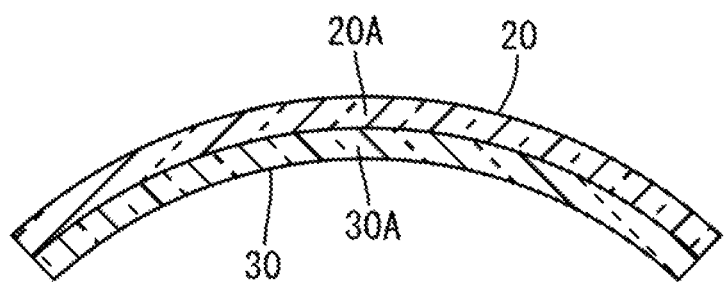
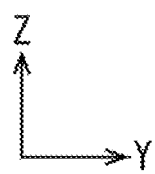
FIG.10
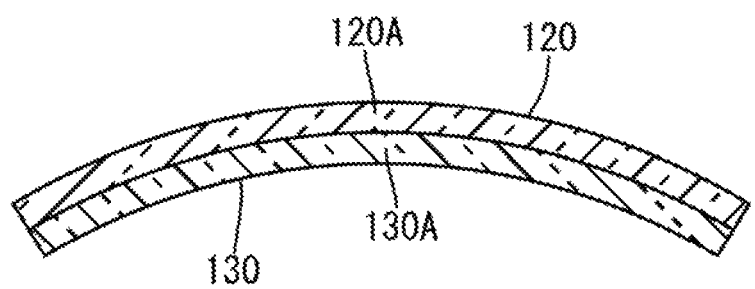
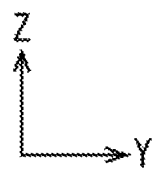

METHOD OF PRODUCING CURVED DISPLAY PANEL

TECHNICAL FIELD

The technology described in this specification relates to a method of producing a curved display panel.

BACKGROUND ART

A curved display panel having a curved display surface has recently been developed to deal with diversification of usage of display panels. For example, Patent Document 1 listed below discloses a method of producing a liquid crystal display apparatus used as a flexible display having a curvable display surface.

RELATED ART DOCUMENT

Patent Document

Patent Document 1: Japanese Unexamined Patent Application Publication No. 2009-204713

Problem to be Solved by the Invention

The method of producing a liquid crystal display apparatus disclosed in Patent Document 1, however, includes bonding two substrates together, making the substrates thinner by etching, and curving the substrates, in this order. Since the substrates are made thinner by etching, each of the substrates may have variations in the thickness. The variations in the thickness of each substrate may lead to a deterioration in display performance of the produced liquid crystal display apparatus.

Furthermore, the substrates each having a thickness reduced by etching as described above may have limitations on the radius of curvature when the substrates are curved with the high display performance being maintained. The substrates cannot be curved to such a small radius of curvature as to meet a requirement of a wearable display, such as a wrist display and a glasses display.

DISCLOSURE OF THE PRESENT INVENTION

The technology disclosed in this specification was made in view of the problems described above, and an object is to produce a curved display panel curved to a small radius of curvature while maintaining high display performance.

Means for Solving the Problem

A technology disclosed in this specification relates to a method of producing a curved display panel. The method includes a supporting step providing two substrates having flexibility and supporting first planar surfaces of the two substrates with supporting boards each having flexibility and a larger thickness than the two substrates, a thin film pattern formation step, after the supporting step, forming a thin film pattern on second planar surfaces of the two substrates, a bonding step, after the thin film pattern formation step, bonding the two substrates at surfaces each having the thin film pattern thereon with the sealant therebetween to form a bonded substrate, a first curving step, after the bonding step, curving the bonded substrate while curing the sealant, a detachment step, after the first curving step, detaching the supporting boards from the bonded substrate, and a second curving step, after the detachment step, further curving the bonded substrate.

In the above-described production method, the two substrates are supported by the corresponding supporting boards in the supporting step. This enables, in the thin film formation step, the formation of a thin film pattern, which is a portion of a display panel such as a switching element and a display element, on the two substrates each having a thickness small enough to be curved to a small radius of curvature. Then, in the bonding step, the surfaces having the thin film pattern thereon are bonded together with the sealant therebetween to form the bonded substrate, which is a component of the display panel. After the formation of the bonded substrate, the sealant may be cured without the bonded substrate being curved, and the bonded substrate may be curved at one time to a small radius of curvature after the supporting boards are detached from the bonded substrate. In such a case, excessive stress is applied to the sealant by the curving and the bonded substrate is forced to return to the state before being curved, making it difficult to the bonded substrate to be curved to a desired radius of curvature.

Contrary to the above, in the above-described production method, since the bonded substrate is curved while the sealant is cured in the first curving step, the bonded substrate is kept being curved to some degrees after the sealant is cured. Thus, after the two substrates are made ready to be readily curved by the detachment of the supporting boards from the bonded substrate in the detachment step, the bonded substrate is able to be further curved to an extremely small radius of curvature in the second curving step. Furthermore, in the above-described production method, since the substrate is not made thinner by etching or the like, a deterioration in display performance of the curved display panel due to variations in the thickness of the substrate is reduced. As described above, in the above-described production method, the bonded substrate is curved in separate two steps and the first curving step is performed while the sealant is cured. This enables the production of the curved display panel curved to a small radius of curvature while maintaining high display performance.

The above-described production method may include a separation step, after the detachment step, separating the bonded substrate into a plurality of bonded substrates. Each of the bonded substrates obtained by separating the bonded substrate in the separation step may be further curved in the second curving step.

In the above-described production method, since the bonded substrate is separated into the plurality of bonded substrates in the separation step, the bonded substrates obtained by the separation each have a smaller size. This enables the bonded substrates to be curved to a smaller radius of curvature in the second curving step than a bonded substrate subjected to the second curving step without the separation step. This enables the production of the curved display panel curved to an extremely small radius of curvature.

In the above-described production method, the sealant may be a photocurable resin and light may be applied to the sealant in the bonding step, and heat may be applied to the sealant in addition to the light in the first curving step.

The above-described method provides a specific method of temporarily fixing the two substrates with the sealant therebetween in the bonding step and fully curing the sealant in the first curving step.

In the above-described production method, a liquid crystal may be dispensed onto one of the two substrates in the bonding step before the two substrates are bonded together.

The above-described method enables a liquid crystal layer to be formed between the two substrates without a step of injecting a liquid crystal between the two substrates after the bonding step. This provides a specific method of sequentially performing the bonding step and the first curving step to produce a curved display panel for a liquid display apparatus.

Advantageous Effect of the Invention

The technology described in this specification enables production of a curved display panel curved to a small radius of curvature while maintaining high display performance.

BRIEF DESCRIPTION OF THE DRAWINGS

FIG. 9 is a cross-sectional view illustrating a production step (5) of the curved liquid crystal panel.

FIG. 10 is a schematic cross-sectional view of a curved liquid crystal panel according to a second embodiment.

MODE FOR CARRYING OUT THE INVENTION

First Embodiment

Figure 1:
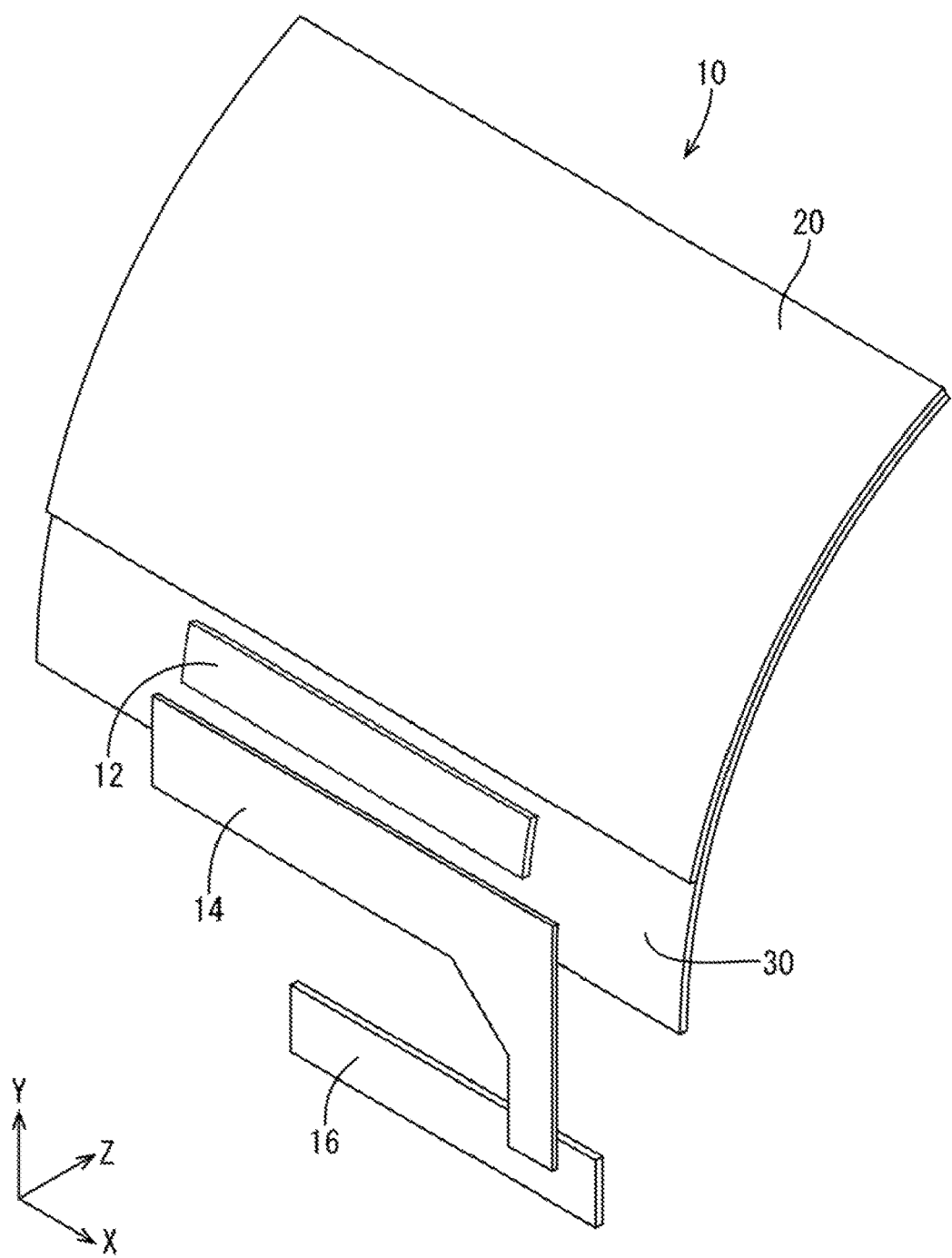
FIG. 1 is a schematic perspective view of a curved liquid crystal panel according to a first embodiment.

A first embodiment is described with reference to FIG. 1 to FIG. 9. In this embodiment, a method of producing a curved liquid crystal panel (one example of a curved display panel) 10, which is included in a liquid crystal display apparatus, is described as an example. In some of the drawings, X axis, Y axis, and Z axis are indicated, and the directions indicated by the axes are common in the drawings. The configuration of the curved liquid crystal panel 10 is described first. The curved liquid crystal panel 10 described in this embodiment is a transmissive liquid crystal panel having an outline size of 2 inches and having a horizontally elongated rectangular outline shape in plan view (see FIG. 2). As illustrated in FIG. 1, short sides of the curved liquid crystal panel 10 are curved. The curved portions of the curved liquid crystal panel 10 each have a radius of curvature of 60 mm.

Figure 2:
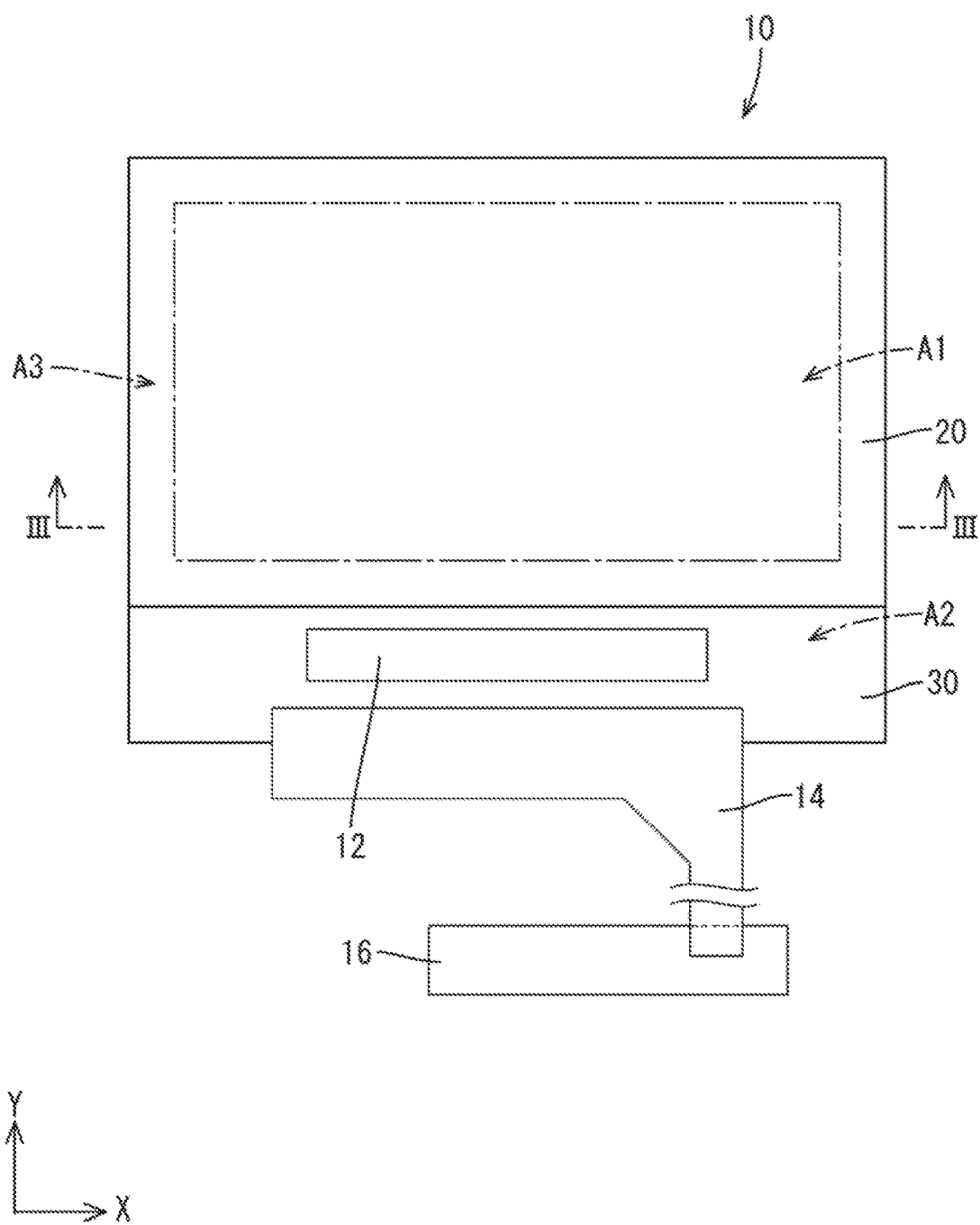
FIG. 2 is a schematic plan view of the curved liquid crystal panel.

As illustrated in FIG. 2, the curved liquid crystal panel 10 includes a display area A1, on which an image is displayed, as a major portion thereof and a non-display area A2, on which an image is not displayed, as a portion outside the display area A1. The non-display area A2 has a frame-shaped area, which encircles the display area A1 and forms a frame of the liquid display apparatus. Hereinafter, the frame-shaped area is referred to as a frame-shaped area A3. An IC chip 12 and a flexible board 14 are mounted on a portion of the non-display area A2 adjacent to one end of the curved liquid crystal panel 10 in the Y-axis direction (lower side in FIG. 1). The IC chip 12 is an electrical component configured to drive the curved liquid crystal panel 10. The flexible board 14 is a board that couples a control board 16, which feeds various input signals from an external component to the IC chip 12, with the curved liquid crystal panel 10.

Figure 3:
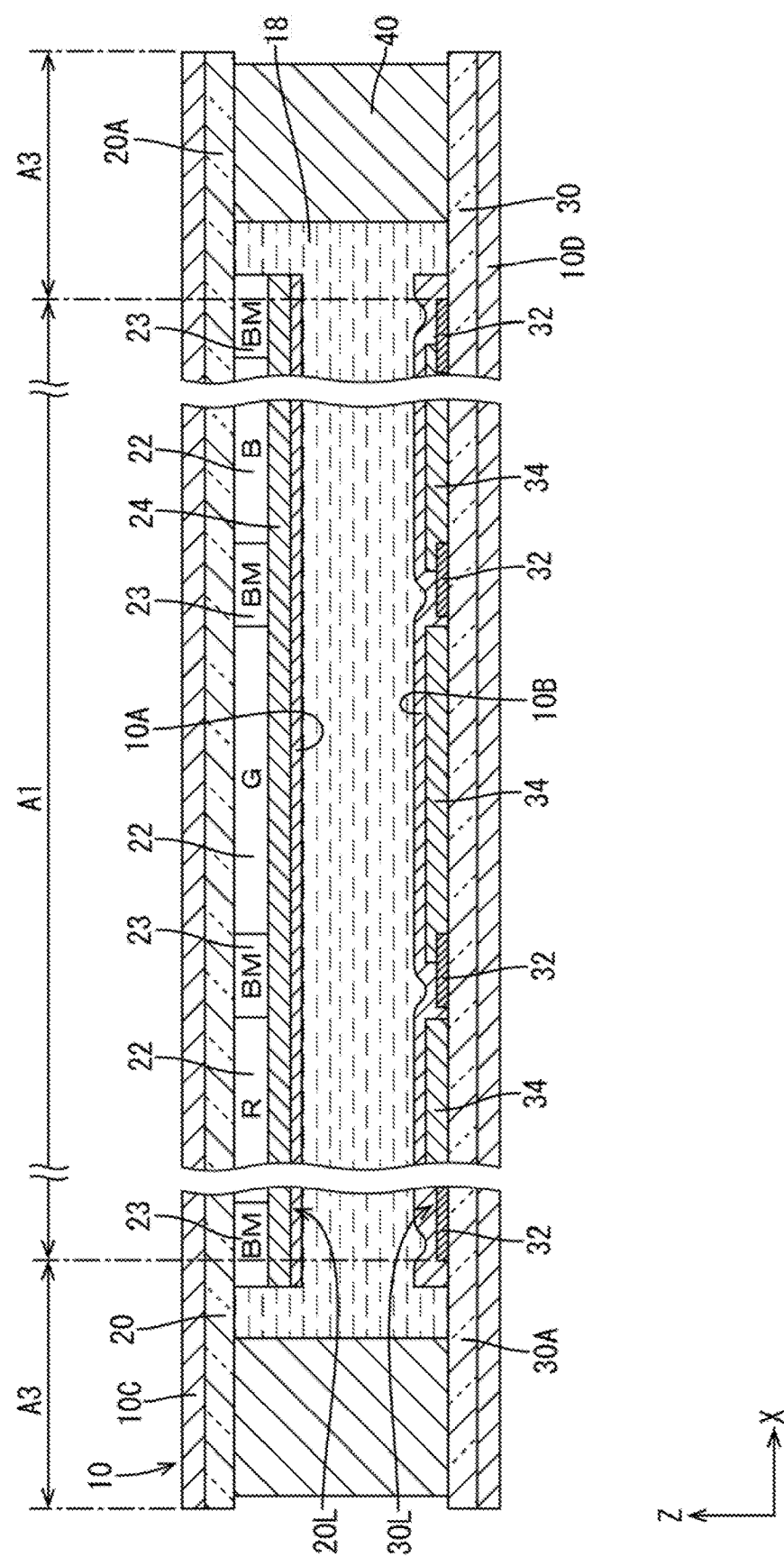
FIG. 3 illustrates a cross-sectional configuration taken along line in FIG. 2 and is a schematic cross-sectional view of the curved liquid crystal panel.

As illustrated in FIG. 2 and FIG. 3, the curved liquid crystal panel 10 includes two glass substrates 20 and 30 having flexibility and high light transmission and a liquid crystal layer 18 including liquid crystal molecules whose optical properties are changed by application of an electrical field. The substrates 20 and 30 included in the curved liquid crystal panel 10 are bonded together by an ultraviolet curable sealant 40 with a cell gap corresponding to the thickness of the liquid crystal layer 18 therebetween. The substrate 20 on a front side (obverse side) is a color filter substrate 20 and the substrate 30 on a rear side (reverse side) is an array substrate 30. Alignment films 10A and 10B, which are configured to orient the liquid crystal molecules included in the liquid crystal layer 18, are on inner sides of the substrates 20 and 30, respectively. Polarizing plates 10C and 10D are attached to outer surfaces of the first glass substrate 20A and the second glass substrate 30A, respectively, of the substrates 20 and 30.

The first glass substrate 20A included in the color filter substrate 20 has a small thickness of 100 μm and the array substrate 30 and the polarizing plate 10c are bonded to a main portion thereof. As illustrated in FIG. 2, the color filter substrate 20 has a dimension in the X-axis direction substantially equal to that of the array substrate 30 and a dimension in the Y-axis direction smaller than that of the array substrate 30. The color filter substrate 20 and the array substrate 30 are bonded together with ends in the Y-axis direction (upper side in FIG. 2) thereof being aligned. Thus, the array substrate 30 do not overlap with the color filter substrate 20 over a predetermined area at a portion adjacent to the other end in the Y-axis direction (lower side in FIG. 2) and front and rear surfaces of the portion are exposed to outside. This area is used as a mounting area of the IC chip 12 and the flexible board 14.

The second glass substrate 30A included in the array substrate 30 has a small thickness of 100 μm and the color filter substrate 20 and the polarizing plate 10D are bonded to a main portion thereof. A portion of the second glass substrate 30A corresponding to the mounting area of the IC chip 12 and the flexible board 14 does not overlap with the color filter substrate 20 and the polarizing plate 10D. The sealant 40 for bonding the substrates 20 and 30, which are included in the curved liquid crystal panel 10, is disposed in the frame-shaped area A3 (see FIG. 3) along an outline of the color filter substrate 20 (substantially elongated rectangular shape in plan view) so as to encircle the display area A1 at a portion where the substrates 20 and 30 are overlapped.

Laminated thin film patterns are formed on an inner side (side adjacent to the liquid crystal layer 18) of the second glass substrate 30A, which is included in the array substrate 30. Specifically, TFTs 32, which are switching elements, and pixel electrodes 34, which are formed of transparent conductive films such as an ITO (Indium Tin Oxide) and connected to the TFTs 32, are arranged in a matrix in plan view on the inner side of the second glass substrate 30A, which is included in the array substrate 30. Gate wiring, source wiring, and capacitor wiring, which are not illustrated, are disposed around the TFTs 32 and the pixel electrodes 34 of the array substrate 30. Terminals of the gate wiring and the capacitor wiring and a terminal of the source wiring are located on an end portion of the array substrate 30. Various signals or a reference potential is input to the terminals from the control board 16 illustrated in FIG. 1 and FIG. 2 to control the drive of the TFTs 32.

As illustrated in FIG. 2, color filters 22, which are adjacent to each other in a matrix, are disposed on the inner side (adjacent to the liquid crystal layer 18) of the first glass substrate 20A, which is included in the color filter substrate 20, at positions overlapping the pixel electrodes 34 of the array substrate 30 in plan view. The color filter 22 includes color portions such as R (red), G (green), and B (blue). A light blocking portion (black matrix) 23 having a substantially lattice-shape is disposed between the color portions included in the color filter 22 to prevent mixture of colors. The light blocking portion 23 overlaps the gate wiring, the source wiring, and the capacitor wiring, which are disposed on the array substrate 30, in plan view. In the curved liquid crystal panel 10, three color portions of R (red), G (green), and B (blue) and three pixel electrodes 34 facing the color portions form one display pixel, which is a display unit. The display pixel includes a red pixel including the R color portion, a green pixel including the G color portion, and a blue pixel including the B color portion. The pixels of each color are repeatedly arranged in a row direction (X-axis direction) on a planar surface of the curved liquid crystal panel 10 to form a pixel group, and pixel groups are arranged in a column direction (Y-axis direction).

As illustrated in FIG. 3, a counter electrode 24 facing the pixel electrode 34 on the array substrate 30 is disposed on the inner side of the color filter 22 and the light blocking portion 23. In the non-display area A2 of the curved liquid crystal panel 10, counter electrode wiring, which is not illustrated, is disposed. The counter electrode wiring is coupled to the counter electrode 24 through a contact hole, which is not illustrated. A reference potential is applied to the counter electrode 24 from the counter electrode wiring. The TFT 32 controls the potential applied to the pixel electrode 34 such that a predetermined potential difference occurs between the pixel electrode 34 and the counter electrode 24. The above is a description of the configuration of the curved liquid crystal panel 10 according to this embodiment. Hereinafter, the above-described components on the array substrate 30 except for an alignment film 10A are collectively referred to as a TFT layer 30L and the above-described components on the color filter substrate 20 except for the alignment film 10B are collectively referred to as a CF layer 20L.

Figure 4:
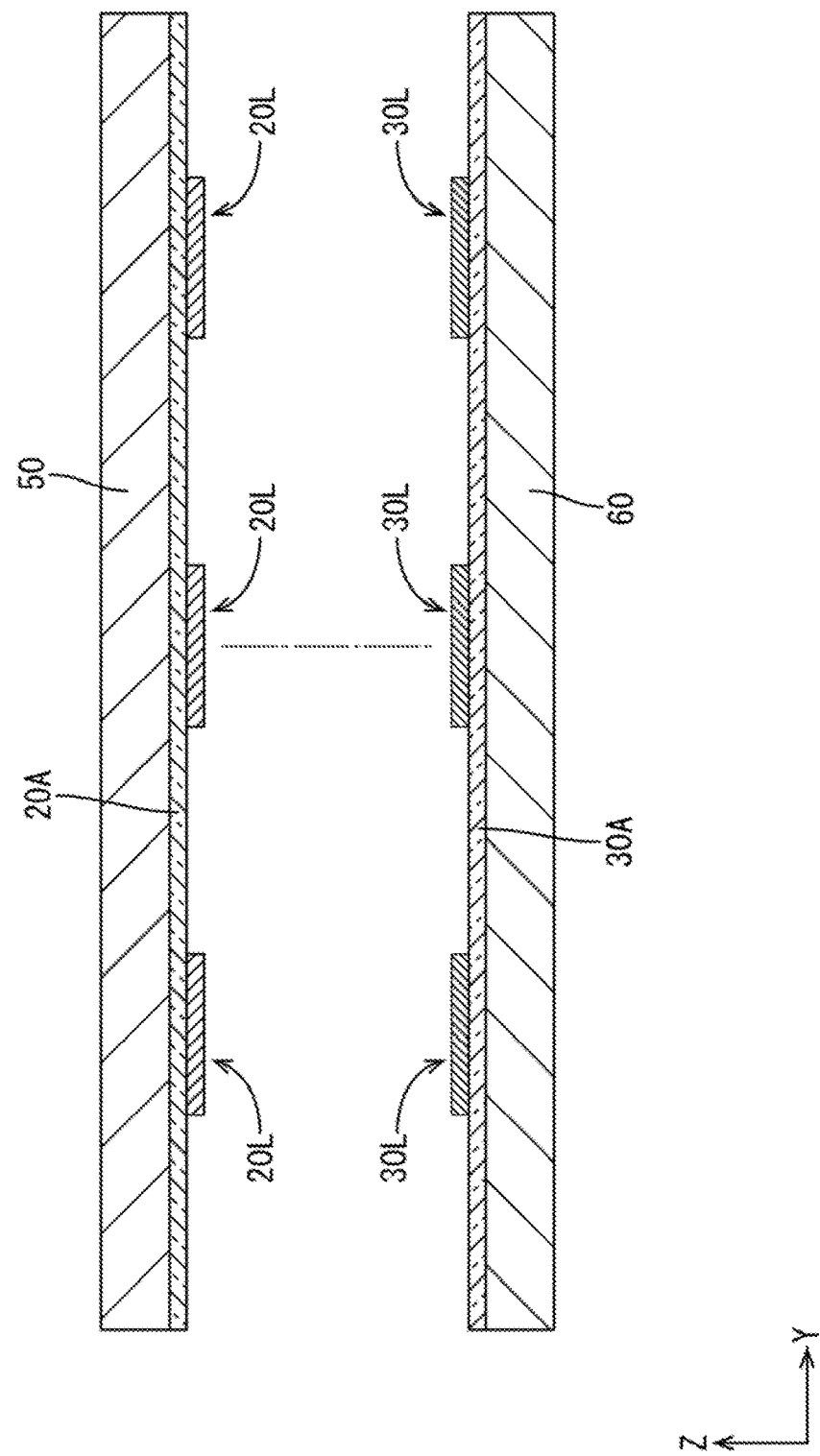
FIG. 4 is a cross-sectional view illustrating a production step (1) of the curved liquid crystal panel.
Figure 5:
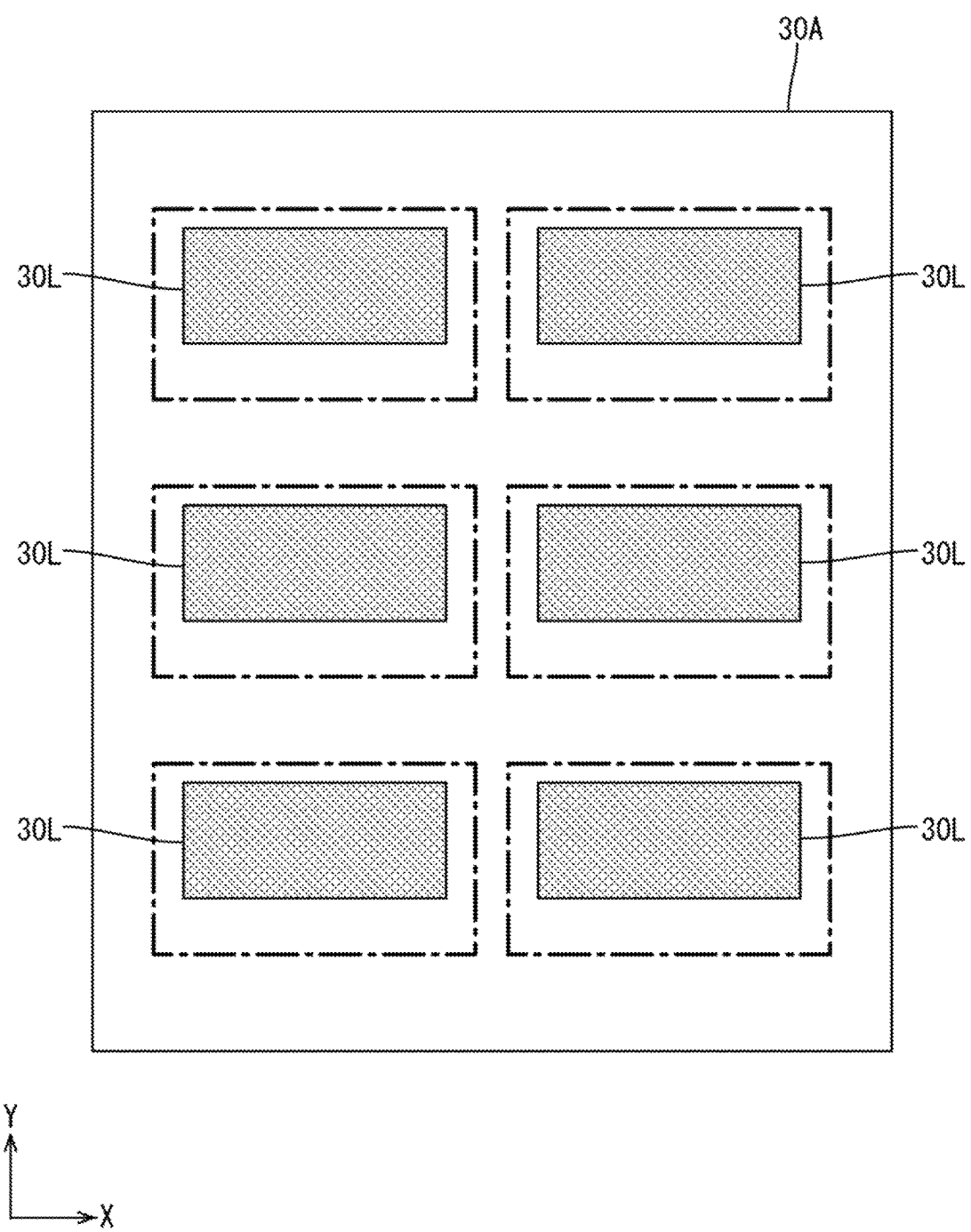
FIG. 5 is a plan view of an array substrate after formation of a TFT layer.
Figure 6:
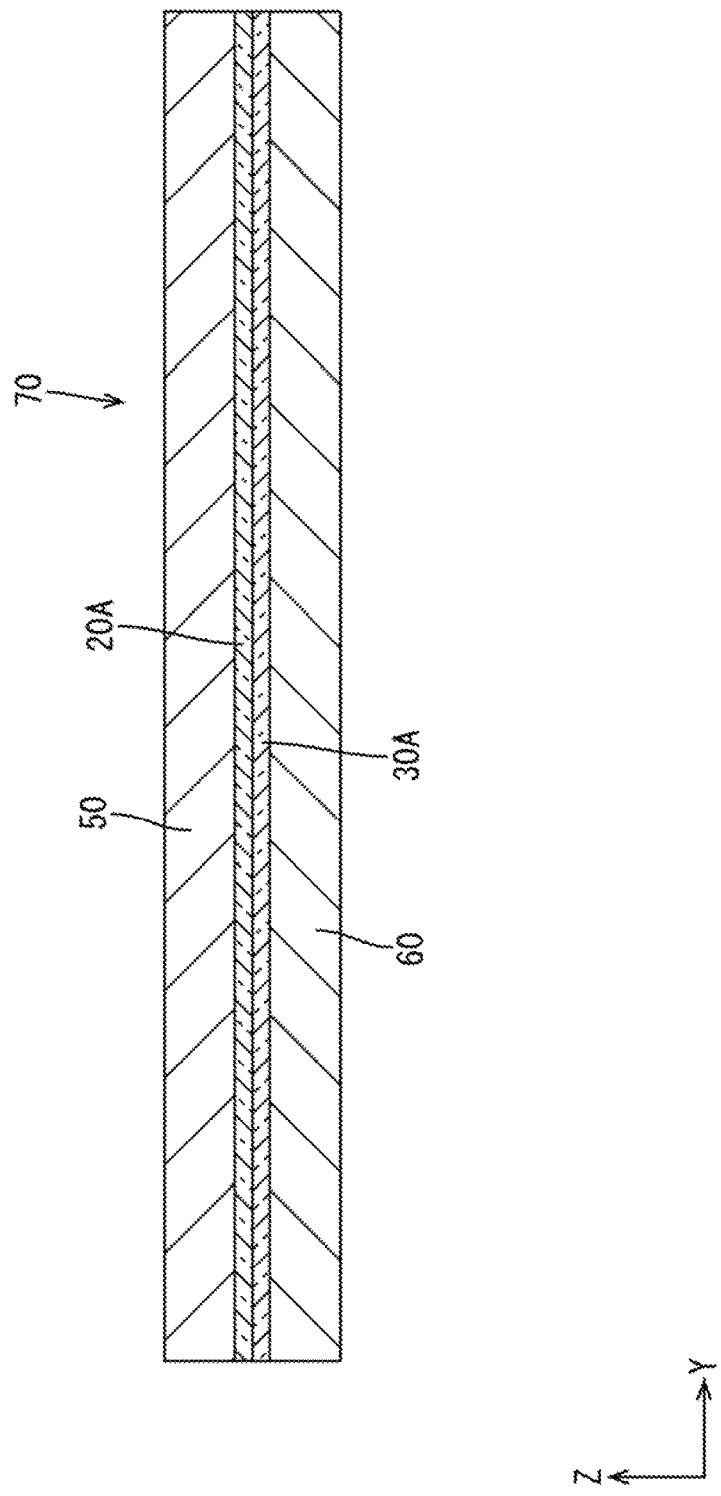
FIG. 6 is a cross-sectional view illustrating a production step (2) of the curved liquid crystal panel.
Figure 7:
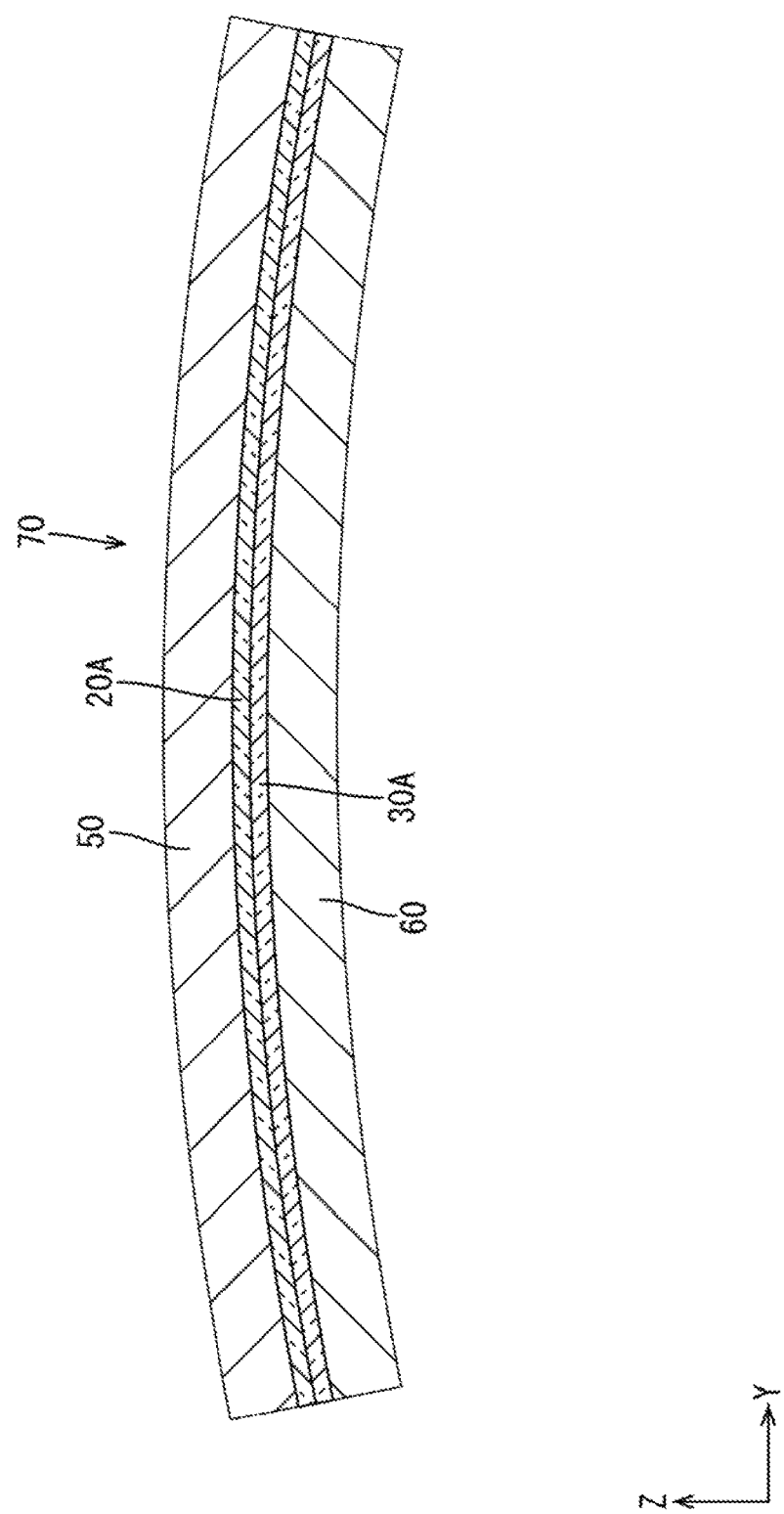
FIG. 7 is a cross-sectional view illustrating a production step (3) of the curved liquid crystal panel.

Next, a method of producing the curved liquid crystal panel 10 having the above-described configuration is described. At first, as illustrated in FIG. 4, the thin first glass substrate 20A, which is included in the color filter substrate 20, is provided. A first transportation board (one example of a support board) 50 is attached to one of two planar surfaces of the first glass substrate 20A opposite a planar surface on which the CF layer 20L is to be formed, such that the first transportation board 50 supports the first glass substrate 20A (supporting step). The first transportation board 50 is attached by using an adhesive or surfactant, for example. The first transportation board 50 is a flexible glass board having a thickness of 400 μm and functions as a reinforcing board, which reinforces the first glass substrate 20A to allow easy formation of the CF layer 20L, when the CF layer 20L is formed on the first glass substrate 20A. Then, the CF layer 20L is formed on one of two planar surfaces of the first glass substrate 20A opposite the planar surface having the first transportation board 50 thereon (thin film pattern formation step).

Furthermore, the thin second glass substrate 30A, which is included in the array substrate 30, is provided. In the same way as the first glass substrate 20A, as illustrated in FIG. 4, a second transportation board (one example of a support board) 60 is attached to one of two planar surfaces of the second glass substrate 30A opposite the planar surface on which the CF layer 20L is to be formed, such that the second transportation board 60 supports the second glass substrate 30A (supporting step). The thickness, material, bonding material, and flexibility of the second transportation board 60 are the same as those of the first transportation board 50. The second transportation board functions as a reinforcing board, which reinforces the second glass substrate 30A to allow easy formation of the TFT layer 30L when the TFT layer 30L is formed on the second glass substrate 30A. Then, the TFT layer 30L is formed on one of the planar surfaces of the second glass substrate 30A opposite the planar surface having the second transportation board 60 thereon (thin film pattern formation step).

A well-known photolithography is used to form the CF layer 20L and the TFT layer 30L on the first glass substrate 20A and the second glass substrate 30A, respectively. Specifically, the first glass substrate 20A and the second glass substrate 30A having the first transportation board 50 and the second transportation board 60 thereon, respectively, are transported through the apparatus used for photolithography, such as a deposition apparatus, a resist coater, and an exposure apparatus, to sequentially form thin films, which form the CF layer 20L and the TFT layer 30L, in layers in a predetermined pattern on corresponding one of the first glass substrate 20A and the second glass substrate 30A. As described above, since the glass substrates 20A and 30A are supported by the transportation boards 50 and 60 attached to the glass substrates 20A and 30A, the glass substrates 20A and 30A each having a small thickness of 100 μm, for example, allows the thin film pattern, which forms the CF layer 20L and the TFT layer 30L, to be formed thereon.

In the production method of this embodiment, a bonded substrate 70 including the first glass substrate 20A and the second glass substrate 30A bonded together is separated into a plurality of bonded substrates in a step described below to produce six curved liquid crystal panels 10 from one bonded substrate 70. Specifically, the CF layers 20L are formed at six places of the first glass substrate 20A and the TFT layers 30L are formed at six places of the second glass substrate 30A (see FIG. 5). The CF layers 20L and the TFT layers 30L are formed on the glass substrates 20A and 30A, respectively, so as to face each other when the glass substrates 20A and 30A are bonded together (see FIG. 4).

Next, the alignment film 10A is formed on the first glass substrate 20A so as to cover the CF layers 20L on the first glass substrate 20A, and the alignment film 10B is formed on the second glass substrate 30A so as to cover the TFT layers 30L on the second glass substrate 30A. The above-described steps form six color filter substrates 20 on the first glass substrate 20A and six array substrates 30 on the second glass substrate 30A. Then, the sealant 40 is applied on the second glass substrate 30A to encircle the TFT layers 30L on the second glass substrate 30A. One-dot chain lines in FIG. 5 indicate portions of the second glass substrate 30A where the sealant 40 is applied.

Then, positions are adjusted such that the CF layers 20L on the first glass substrate 20A face the TFT layers 30L on the second glass substrate 30A (see FIG. 4), and liquid crystals are dispensed onto the areas of the second glass substrate 30A encircled by the sealant 40 in accordance with the ODF (One Drop Fill) method using a liquid crystal dispensing apparatus. Then, the glass substrates 20A and 30A are bonded together with the sealant 40 therebetween to form the bonded substrate 70 illustrated in FIG. 6 (bonding step). The bonding step is performed while ultraviolet rays are applied to the sealant 40. This cures the sealant 40 to some degree and temporarily fixes the glass substrates 20A and 30A. The bonding of the glass substrates 20A and 30A causes the dispensed liquid crystals to spread in a planar direction of the second glass substrates 30A and fill the areas encircled by the sealant 40. As a result, the liquid crystal layer 18 is formed between the glass substrates 20A and 30A. In FIG. 6 to FIG. 9, the CF layers 20L on the first glass substrate 20A, the TFT layers 30L on the second glass substrate 30A, the sealant 40, and the liquid crystal layer 18 are not illustrated for ease of illustration.

Then, the bonded substrate 70 is curved to a predetermined radius of curvature (first curving step). The predetermined radius of curvature herein is a radius of curvature larger than the radius of curvature of the produced curved liquid crystal panel 10 (desired radius of curvature). In this embodiment, the predetermined radius of curvature is larger than 60 mm, which is the radius of curvature of the produced curved liquid crystal panel 10. In the first curving step, the bonded substrate 70 is placed between a lower curved casing having a protruded curved surface with the predetermined radius of curvature and an upper curved casing having a concave curved surface with the predetermined radius of curvature, and the bonded substrate 70 is sandwiched and pressed by the curved casings, for example. The first curving step is performed while the sealant 40 is cured. Specifically, the first curving step is performed while ultraviolet rays are applied to the sealant 40 and heat is applied to the bonded substrate 70. As a result, the sealant 40 is fully cured, and thus the bonded substrate 70 curved to the predetermined radius of curvature maintains the state.

Figure 8:
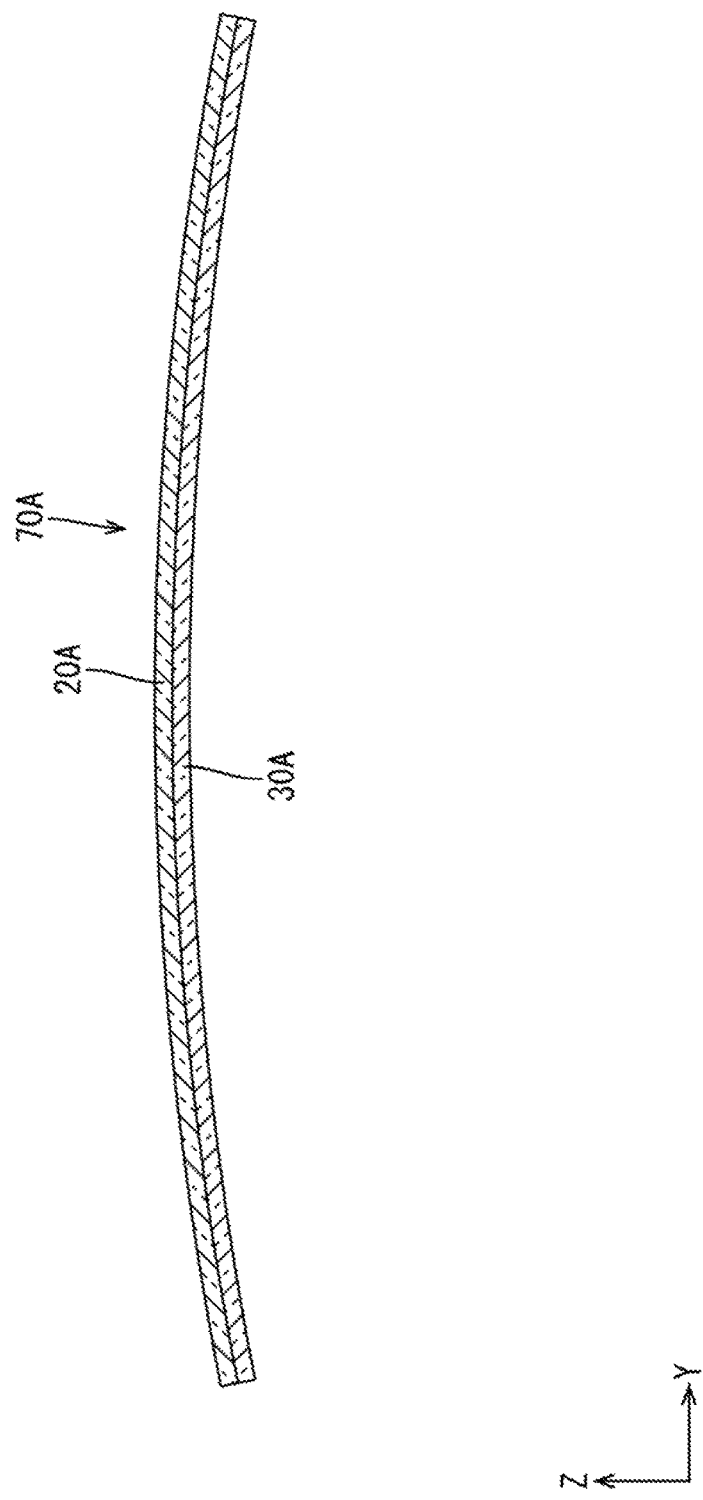
FIG. 8 is a cross-sectional view illustrating a production step (4) of the curved liquid crystal panel.

Next, as illustrated in FIG. 8, the transportation boards 50 and 60 are detached from the bonded substrate 70 (detachment step). Hereinafter, the bonded substrate 70 from which the transportation boards 50 and 60 are detached is referred to as a bonded substrate after detachment 70A. The transportation boards 50 and 60 may be detached by a physical method, for example. Alternatively, a separation film formed of polyimide and a separation film formed of molybdenum may be formed between the glass substrates 20 and 30 and the transportation boards 50 and 60, and then a laser may be applied to the bonded substrate 70 in a direction perpendicular to the planer direction thereof for interface separation of the separation films. As a result of the detachment of the transportation boards 50 and 60 from the bonded substrate 70, the glass substrates 20 and 30 are not supported by the transportation boards 50 and 60. Thus, the strength of the bonded substrate after detachment 70A is lowered, enabling the bonded substrate after detachment 70A to be further curved. Since the detachment step is performed after the sealant is cured, the glass substrates 20 and 30 are not separated in the detachment step in which the transportation boards 50 and 60 are detached from the bonded substrate 70. Then, the polarizing plates 10C and 10D each in a curved state are attached to outer surfaces of the bonded substrate 70 (planar surfaces opposite the planar surfaces having the thin film patterns thereon).

Next, the bonded substrate after detachment 70A is adhered to a casing having a convex curved surface, and then a laser is applied to the bonded substrate after detachment 70A to cut the bonded substrate after detachment 70A along an outer shape (horizontally elongated rectangular shape in this embodiment) of a curved liquid crystal panel 10, which is to be produced, such that the bonded substrate after detachment 70A is separated into six bonded substrates after detachment 70A (separation step). Next, the bonded substrates after detachment 70A are each further curved to the radius of curvature corresponding to that of the produced curved liquid crystal panel 10 (60 mm in this embodiment) (second curving step). In the second curving step, as in the first curving step, the bonded substrate after detachment 70A is sandwiched and pressed by two casings at a convex curved surface and a concave curved surface each having a radius of curvature corresponding to the produced curved liquid crystal panel 10. Then, the IC chip 12 and the flexible board 14, for example, are mounted on the bonded substrate after detachment 70A at a position corresponding to the non-display area A2 of the curved liquid crystal panel 10. As a result, the curved liquid crystal panel of this embodiment is obtained.

When the bonded substrate after detachment 70A is further curved, stress is applied to the sealant 40, and thus the bonded substrate after detachment 70A after the second curving step is forced to return to the state before the first curving step to some degrees. However, the produced curved liquid crystal panel 10 may be placed in a chassis or the like, which is an exterior component of the liquid crystal display apparatus. This allows the state of the bonded substrate after detachment 70A after the second curving step to be kept by an adhesive between the curved liquid crystal panel 10 and an inner surface of the exterior component. Since the curved liquid crystal panel 10 has a small radius of curvature of 60 mm, the liquid crystal display apparatus including the curved liquid crystal panel 10 according to this embodiment is able to be used as a wearable display such as a wrist display and a glass display.

As described above, in the method of producing the curved liquid crystal panel 10 of this embodiment, since the first transportation board 50 and the second transportation board 60 are attached to the glass substrates 20A and 30A, respectively, in the supporting step, the glass substrates 20A and 30A are supported by the first transportation board 50 and the second transportation board 60. This enables the thin film patterns (TFT layer 30L, CF layer 20L), which form the TFT 32, the pixel electrode 34, and the counter electrode 24, for example, to be formed on a thin substrate, such as the glass substrates 20A and 30A of this embodiment each having a thickness of 100 μm.

Then, in the bonding step, the surfaces having the thin film pattern thereon are bonded with the sealant 40 therebetween to form the bonded substrate 70, which is included in the curved liquid crystal panel 10. After the formation of the bonded substrate, the sealant may be cured without the bonded substrate being curved, and the bonded substrate may be curved at one time to a small radius of curvature after the first transportation board and the second transportation board are detached from the bonded substrate. In such a case, excessive stress is applied to the sealant by the curving and the bonded substrate is forced to return to the state before being curved, making it difficult to the bonded substrate to be curved to the desired radius of curvature.

Contrary to this, in the method of producing the curved liquid crystal panel 10 of this embodiment, since the bonded substrate 70 is curved while the sealant 40 is cured in the first curving step, the bonded substrate 70 is kept curved to some degrees after the sealant 40 is cured. Thus, the bonded substrate after detachment 70A is able to be further curved to an extremely small radius of curvature (60 mm) in the second curving step, after the glass substrates 20A and 30A are made ready to be readily curved by the detachment of the first transportation board 50 and the second transportation board 60 from the bonded substrate 70 in the detachment step.

Furthermore, in the method of producing the curved liquid crystal panel 10 of this embodiment, since the glass substrates 20A and 30A are not made thinner by etching or the like, a deterioration in display performance of the curved liquid crystal panel 10 due to variations in the thickness of the glass substrates 20A and 30A is reduced. As described above, in the production method of this embodiment, the bonded substrate 70 is curved in two separate steps (first curving step and second curving step), and the first curving operation (first curving step) is performed while the sealant 40 is cured. This enables the production of the curved display panel 10 curved to a small radius of curvature while maintaining high display performance.

In the production method of this embodiment, since the bonded substrate after detachment 70A is separated into six bonded substrates after detachment 70A in the separation step, the bonded substrates after detachment 70A after the separation each have a smaller size. Thus, the bonded substrate after detachment 70A is curved to a smaller radius of curvature in the second curving step than a bonded board after detachment subjected to the second curving step without the separation step. This enables the production of the curved liquid crystal panel 10 curved to an extremely small radius of curvature (for example, 60 mm as in this embodiment).

Second Embodiment

A second embodiment is described with reference to FIG. 10. A curved liquid crystal panel 110 according to the second embodiment is a reflective liquid crystal panel having an outline size of two inches and including a curved portion having a radius of curvature of 75 mm. As illustrated in FIG. 10, the curved liquid crystal panel 110 according to this embodiment is curved less than the curved liquid crystal panel 10 of the first embodiment. The curved liquid crystal panel 110 is produced by further curving each of the bonded substrates after detachment, which are obtained by separating one bonded substrate, to a radius of curvature (75 mm) corresponding to that of the produced liquid crystal panel in the second curving step of the above-described production steps.

Third Embodiment

A third embodiment is described. In the third embodiment, a curved organic EL panel (one example of the curved display panel), which is included in an organic EL (Electro Luminescence) display apparatus, is described as an example. The curved organic EL panel of the third embodiment has an outline size of two inches and includes a curved portion having a radius of curvature of 60 mm. The curved organic EL panel is produced by forming an organic EL emissive layer in the bonding step of the production steps, instead of dispensing liquid crystal onto the second glass substrate, before the glass substrates are bonded together.

Modifications of the above-described embodiments are described below.

(1) In the above-described embodiments, the produced liquid crystal panel (organic EL panel) having the radius of curvature of 60 mm or 75 mm is described as an example, but the radius of curvature of the produced liquid crystal panel (organic EL panel) is not limited. Furthermore, the degree of curve of the bonded substrate in each of the first curving step and the second curving step is not limited.

(2) The above-described embodiments describe the method in which the bonded substrate (bonded substrate after detachment) is sandwiched and pressed by the two casings for curving such that the bonded substrate (bonded substrate after detachment) is curved in the first curving step and the second curving step, as an example. However, the apparatus and method of curving the bonded substrate (bonded substrate after detachment) in the first curving step and the second curving step are not limited.

(3) The above-described embodiments describe that six curved liquid crystal panels (curved organic EL panels) are produced from one bonded substrate, as an example, but the present invention is not limited thereto. One curved liquid crystal panel may be produced from one bonded substrate, for example.

(4) The above-described embodiments describe the methods of producing the liquid crystal panel included in the liquid crystal display apparatus and the curved organic EL panel included in the organic EL display apparatus, but the type of display apparatus including the display panel produced by the method according to the present invention is not limited.

The embodiments of the present invention are described above in detail, but the description is merely an example and does not limit the scope of claims. The technology in the scope of the claims includes modifications and changes, which may be added to the above-described specific examples.

EXPLANATION OF SYMBOLS 10, 110 liquid crystal panel
18 liquid crystal layer
20, 120 color filter substrate
20A, 120A first glass substrate
20L CF layer
24 counter electrode
30, 130 array substrate
30A, 130A second glass substrate
30L TFT layer
32 TFT
34 pixel electrode
40 sealant
50 first transportation board
60 second transportation board
70 bonded substrate
70A bonded substrate after detachment

The invention claimed is:

1. A method of producing a curved display panel comprising:
   a supporting step providing two substrates having flexibility and supporting first planar surfaces of the two substrates with supporting boards each having flexibility and a larger thickness than the two substrates;
   a thin film pattern formation step, after the supporting step, forming a thin film pattern on second planar surfaces of the two substrates;
   a bonding step, after the thin film pattern formation step, bonding the two substrates at surfaces each having the thin film pattern thereon with a sealant therebetween to form a bonded substrate;
   a first curving step, after the bonding step, curving the bonded substrate while curing the sealant;

a detachment step, after the first curving step, detaching the supporting boards from the bonded substrate; and a second curving step, after the detachment step, further curving the bonded substrate.

2. The method of producing a curved display panel according to claim 1, further comprising a separation step, after the detachment step, separating the bonded substrate into a plurality of bonded substrates wherein each of the bonded substrates obtained by separating the bonded substrate in the separation step are further curved in the second curving step.

3. The method of producing a curved display panel according to claim 1, wherein the sealant is a photocurable resin and light is applied to the sealant in the bonding step, and heat is applied to the sealant in addition to the light in the first curving step.

4. The method of producing a curved display panel according to claim 1, wherein a liquid crystal is dispensed onto one of the two substrates in the bonding step before the two substrates are bonded together.

5. The method of producing a curved display panel according to claim 1, wherein the bonding step further comprising forming an organic electro luminescence emissive layer before bonding the two substrates.

* * * * *